United States Patent
Hsu

(10) Patent No.: US 8,222,823 B2
(45) Date of Patent: Jul. 17, 2012

(54) WIRELESS-CONTROLLED SOLAR BRICK

(75) Inventor: Min-Chia Hsu, Pingtung (TW)

(73) Assignee: Rooster Lighting Co., Ltd., Pingtung (TW)

(*) Notice: Subject to any disclaimer, the term of this patent is extended or adjusted under 35 U.S.C. 154(b) by 408 days.

(21) Appl. No.: 12/458,517

(22) Filed: Jul. 15, 2009

(65) Prior Publication Data

US 2011/0011435 A1    Jan. 20, 2011

(51) Int. Cl.
*H05B 37/02* (2006.01)
*H01L 31/052* (2006.01)
*H01L 31/042* (2006.01)

(52) U.S. Cl. .................. 315/149; 362/183; 136/244

(58) Field of Classification Search .............. 136/205, 136/206, 230, 231, 243, 244, 245, 252, 253, 136/247; 362/183; 315/149, 150, 151
See application file for complete search history.

(56) References Cited

U.S. PATENT DOCUMENTS

| | | | | |
|---|---|---|---|---|
| 6,339,188 B1 * | 1/2002 | Voelkner | | 136/251 |
| 2006/0012996 A1 * | 1/2006 | Tseng | | 362/253 |
| 2006/0102225 A1 * | 5/2006 | Chou | | 136/244 |
| 2008/0266846 A1 * | 10/2008 | Cheng et al. | | 362/183 |
| 2009/0165841 A1 * | 7/2009 | Gunn et al. | | 136/245 |

* cited by examiner

*Primary Examiner* — Douglas W Owens
*Assistant Examiner* — Minh D A
(74) *Attorney, Agent, or Firm* — Rosenberg, Klein & Lee

(57) ABSTRACT

A wireless-controlled solar brick includes a circuit board disposed with a microcontroller that connects with a signal receiver and a plurality of light sources. A solar panel is disposed above the circuit board. There is a remote controller corresponding to the solar brick. The remote controller consists of a control module connected with a signal transmitter. The solar brick is placed on flat surface, such as the ground or a wall. Sunlight can be absorbed by the solar panel to generate electric power for further storage of the same. While in the dark or at night, the light source emits light to allow the solar brick to be seen clearly under conditions of low visibility. The colors or lighting patterns of the solar brick can be changed by using the remote controller, thereby providing a dynamic light and shadow show on the flat surface.

2 Claims, 4 Drawing Sheets

WIRELESS-CONTROLLED SOLAR BRICK

BACKGROUND OF THE INVENTION

1. Fields of the Invention

The present invention relates to a wireless-controlled solar brick, especially to a brick that is placed on outdoor flat surfaces, such as the ground or walls. The brick not only absorbs sunlight to produce electricity and store the electricity for use in the dark or at night. Under conditions of low visibility, the brick can still be seen clearly by the light emitting therefrom. Moreover, the lighting colors, lighting sequences and patterns of the brick are controlled by a wireless remote control way. Thus the ground or wall arranged with the bricks has dynamic light and shadow, so that the operation of the brick is easy and convenient as well as the power of the brick coming from solar energy is environmental protection and energy saving. Therefore, the wireless-controlled solar brick is more practical and convenient to use.

2. Descriptions of Related Art

In many outdoor public areas, various types of bricks placed on the ground or walls. The bricks with different colors are arranged to form specific patterns so as to create beautiful surroundings.

However, the patterns or figures formed by the bricks with different colors arranged on the ground or walls are fixed, unable to change the settings. Thus it's a bit monotonous. Moreover, when it's dark or at night without sufficient light, people cannot see the colors and figures of the lighting bricks clearly due to low visibility. There is a need to dispose lights for illumination. This is not only inconvenience in use but also lead to waste of power. Thus there is a need to improve the brick with more functions.

The present invention provides a wireless-controlled solar brick to mitigate or obviate the aforesaid shortcoming and problems.

SUMMARY OF THE INVENTION

A primary object of the present invention to provide a wireless-controlled solar brick that is placed on outdoor flat surfaces, such as the ground or wall, and having a solar panel that converts solar energy to electricity and stores the electricity for use. When it is dark and gloomy, light from a light source passes a light transmitting part to emit outward so that the disposition of the solar brick can be seen clearly. Thus the solar brick getting power from solar energy is environmental protection and energy saving. Therefore, the solar brick is more practical and convenient to use.

The wireless-controlled solar brick includes a circuit board mounted in a base seat. The circuit board includes a plurality of light sources therearound and a solar panel disposed on the top surface thereof. A surface cover is covered over the base seat. The surface cover includes a plurality of light emitting parts corresponding to the light sources around the circuit board and a light transmitting part corresponding to the solar panel. Still, the lighting colors and lighting sequences of the solar brick are controlled in a wireless remote control way. Thus the ground or wall arranged with solar bricks has dynamic light and shadow. The solar brick is with more practicability due to easy and convenient operation.

As to Another object o the present invention, the solar brick further includes a microcontroller connected with a signal receiver as well as the light sources. A remote controller for the solar brick is provided. The remote controller consists of a control module connected with a signal transmitter. Users input control commands via the control module of the remote controller, and the control commands can be sent from the signal transmitter to the microcontroller via the signal receiver, so as to control lighting patterns of the light sources.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENT

Figure 1:
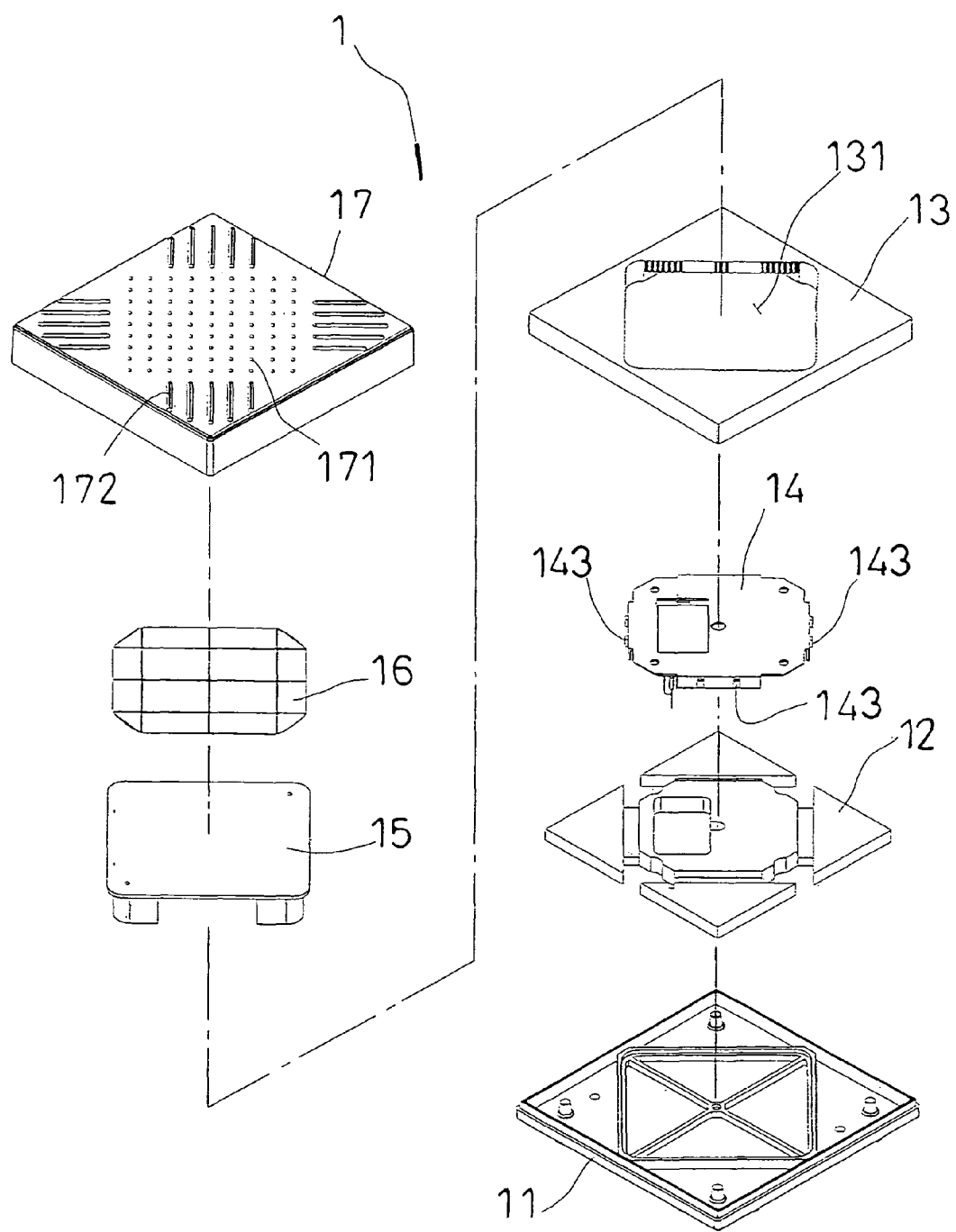
FIG. 1 is a perspective explosive view of an embodiment according to the present invention.
Figure 2:
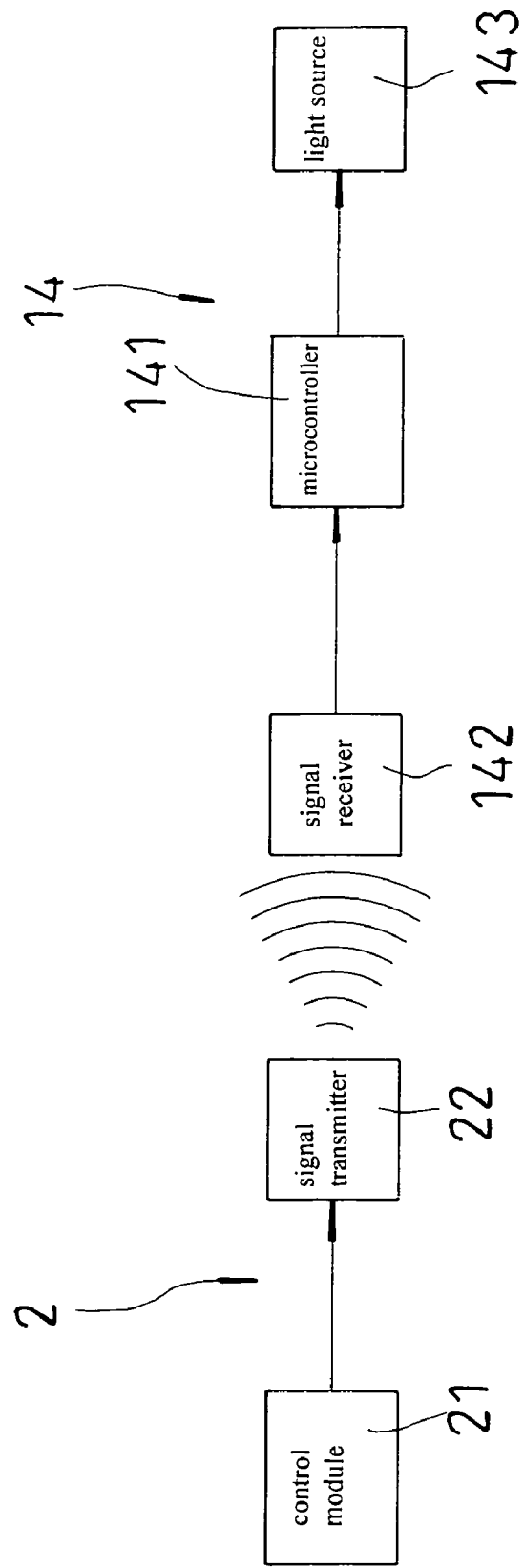
FIG. 2 is a block diagram showing structure of an embodiment according to the present invention.

Firstly, referring to FIG. 1 and FIG. 2, a wireless-controlled solar brick (1) of the present invention includes a base seat (11), a loading block (12), a light diffusing block (13), a circuit board (14), a protection plate (15), a solar panels (16) and a surface cover (17). A remote controller (2) is used in combination with the wireless-controlled solar brick (1).

The loading block (12) made from shock resistant material and having a function of optimal shock absorption is disposed above the base seat (11). The light diffusing block (13) for evenly diffusing and conducting light is mounted with a receiving through hole (131) that receives the circuit board (14) therein. The light diffusing block (13) is arranged over the loading block (12). The circuit board (14) is disposed with a microcontroller (141) that is connected with both a signal receiver (142) and a plurality of light sources (143). The protection plate (15) is covered over the circuit board (14) for protection of the circuit board (14). The solar panel (16) for absorbing solar energy and generating electricity is loaded over the protection plate (15). The electricity is transmitted to the circuit board (14) for storage. The surface cover (17) is covered over and fixed on the base seat (11). A light transmitting part (171) is formed at a position corresponding to the solar panel (16). The surface cover (17) includes a plurality of light emitting parts (172) corresponding to the light sources (143) around the circuit board (14).

The remote controller (2) consists of a control module (21) connected with a signal transmitter (22). The signal transmitter (22) is used to send out control signals received by the signal receiver (142) on the circuit board (14) of the solar brick (1).

Figure 3:
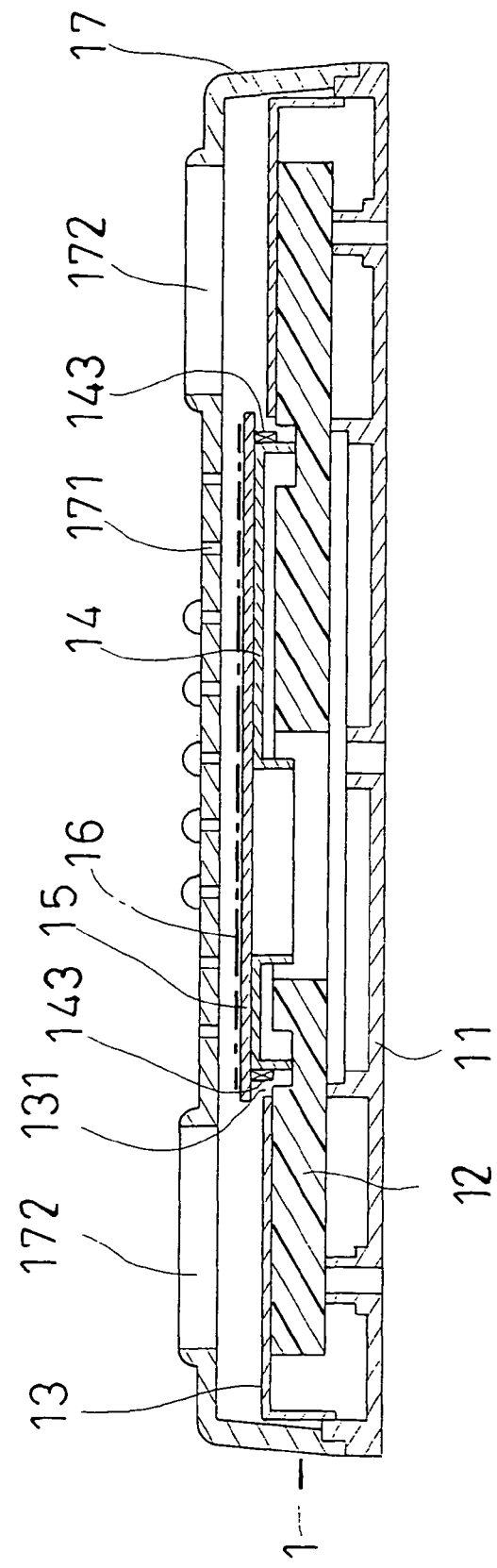
FIG. 3 is a cross sectional view of an assembled embodiment according to the present invention.
Figure 4:
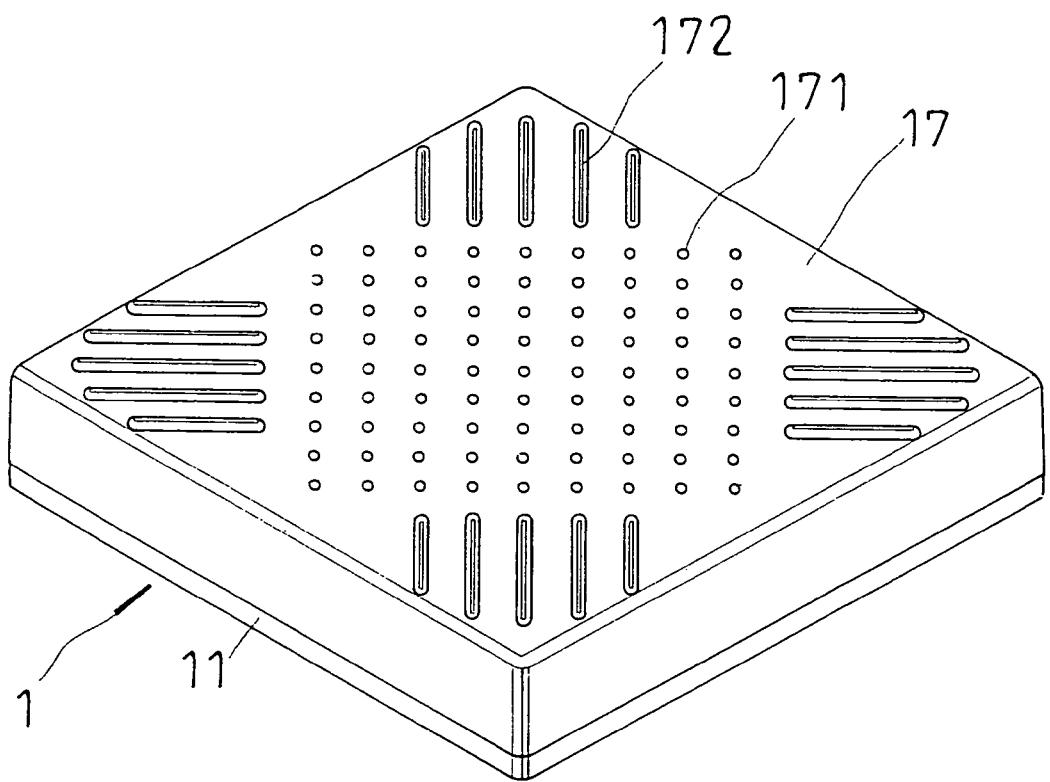
FIG. 4 is a perspective view of an assembled embodiment according to the present invention.

Referring to FIG. 3 and FIG. 4, the loading block (12) is arranged above the base seat (11), the light diffusing block (13) is disposed over the loading block (12) and the circuit board (14) is mounted in the receiving through hole (131) of the light diffusing block (13). Now the circuit board (14) is just disposed above the loading block (12) and is provided with a function of shock absorption as well as protection by the loading block (12). Then the protection plate (15) is covered on the circuit board (14) and the solar panel (16) is loaded above the protection plate (15). At last, the surface cover (17) is covered over and fixed on the base seat (11).

While there is sufficient light, sunlight passes the light transmitting part (171) on the surface cover (17) of the solar brick (1) and arrives the solar panel (16) so that the solar panel

(16) converts the sunlight into electric power and the electricity is transmitted to the circuit board (14) for storage. When it gets dark or at night, each light source (143) of the circuit board (14) starts emitting light and the light from the light source (143) passes through the light diffusing block (13) to be diffused evenly and finally emitting out of the light emitting part (172) of the surface cover (17).

Moreover, By means of the control module (21) of the remote controller (2), users can input various control commands to the device and the control commands are sent by the signal transmitter (22). After the control commands being received by the signal receiver (142), they are transmitted to the microcontroller (141) so as to control lighting patterns of the light sources (143) connected with the microcontroller (141).

Compared with the structure available now, the present invention has following advantages:
1. By the solar panel, sunlight is absorbed to generate electricity that is stored for use. In gloomy conditions or at night, the light sources emit light through the light transmitting part of the surface cover so as to lighten the wireless-controlled solar brick. Moreover, the solar brick getting power from solar energy is environmental protection and energy saving.
2. Control commands are input by the remote controller. After the signals from the signal transmitter being received by the signal receiver of the solar brick, lighting patterns of the light sources can be controlled. Thus the colors, lighting sequences and patterns of the solar brick are controlled in a wireless remote control way. The ground or wall formed by solar bricks can create dynamic light and shadow. The device is with more practicability due to easy and convenient operation.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:
1. A wireless-controlled solar brick comprising:
a base seat;
a circuit board provided with a plurality of light sources and disposed on a top surface of the base seat;
a solar panel disposed above the circuit board;
a surface cover formed with a light transmitting part corresponding to the solar panel and with a plurality of light emitting parts corresponding to the light sources around the circuit board, covered and fixed on the base seat; a loading block positioned above the base seat; a light diffusing block positioned above the loading block and mounted with a through hole receiving the circuit board therein; and, a protection plate covering the circuit board with said solar panel mounted over said protection plate.
2. The wireless-controlled solar brick as claimed in claim 1, wherein the light sources around the circuit board are light emitting diodes.

\* \* \* \* \*